United States Patent [19]

Polata et al.

[11] 3,895,392

[45] July 15, 1975

[54] BIPOLAR TRANSISTOR STRUCTURE HAVING ION IMPLANTED REGION AND METHOD

[75] Inventors: Bohumil Polata, Los Altos; James A. Marley, Jr., Saratoga; John T. Kerr, Cupertino, all of Calif.

[73] Assignee: Signetics Corporation, Sunnyvale, Calif.

[22] Filed: May 10, 1974

[21] Appl. No.: 468,699

Related U.S. Application Data

[63] Continuation of Ser. No. 348,218, April 5, 1973, abandoned, which is a continuation of Ser. No. 89,193, Nov. 13, 1970, abandoned.

[52] U.S. Cl. .................... 357/44; 357/20; 357/49; 357/88; 357/91

[51] Int. Cl. .................... H01l 19/00

[58] Field of Search .................... 357/91, 20, 88, 44, 49

[56] References Cited

UNITED STATES PATENTS

| | | | |
|---|---|---|---|
| 3,226,613 | 12/1965 | Halnichen | 317/234 |
| 3,595,715 | 7/1971 | Thire | 148/175 |
| 3,739,237 | 6/1973 | Shannon | 317/235 R |

*Primary Examiner*—Martin H. Edlow
*Attorney, Agent, or Firm*—Flehr, Hohbach, Test, Albritton & Herbert

[57] ABSTRACT

Bipolar transistor structure formed of a semiconductor body having a substantially planar surface with collector, base and emitter regions formed therein and a layer of insulating material on said surface and having openings formed therein exposing said surface in areas overlying at least the base and emitter regions. The emitter region is formed by bombardment on the surface at least prior to the formation of the emitter region.

19 Claims, 18 Drawing Figures

INVENTORS
BOHUMIL POLATA
JAMES A. MARLEY, JR.
JOHN T. KERR
BY
Flehr, Hohbach, Test, Albritton & Herbert

INVENTORS
BOHUMIL POLATA
JAMES A. MARLEY, JR.
JOHN T. KERR

BY

Flehr, Hohbach, Test, Albritton & Herbert

BIPOLAR TRANSISTOR STRUCTURE HAVING ION IMPLANTED REGION AND METHOD

This is a continuation, of application Ser. No. 348,218 filed Apr. 5, 1973 which is a continuation of Ser. No. 89,193 filed Nov. 13, 1970, now abandoned.

BACKGROUND OF THE INVENTION

1. Field of the Invention

This invention relates to bipolar transistor structures utilizing ion implantation and a method for making the same.

2. Description of the Prior Art

Semiconductor devices utilizing ion implanted regions have heretofore been provided. However, at the present time ion implantation has not been utilized in certain applications wherein it gives excellent results. For example, complementary transistor circuits have heretofore been provided. However, in the past, three complementary transistor structures have been fabricated by the use of diffusion techniques. Compromises have had to be made in the fabrication of the NPN and PNP devices in the same semiconductor body when utilizing diffusion techniques.

Bipolar transistors are being fabricated using all-diffused technology, that is introduction of impurities is done by thermal process. While this approach is satisfactory for deep structures, difficulties are encountered where sub-micron base-emitter structures are to be made. The difficulties arise from the fact that both the junction depth and the concentration for base and for emitter must be controlled using thermal means and thus the subsequent step will affect the proceeding one. In the case of a complementary structure, here base and emitter for the NPN and PNP devices must be precisely controlled, these difficulties are particularly pronounced.

Therefore, it is desirable to have the ability to form the semiconductor layer (or layers) without affecting the layer (or layers) formed previously. This could only be done when the substrate is not exposed to temperatures at which diffusions take place. There is therefore need for a new and improved bipolar transistor structure and the method for making the same.

SUMMARY OF THE INVENTION AND OBJECTS

The bipolar transistor structure consists of a semiconductor body which has a substantially planar surface. A collector region is formed in the semiconductor body and is of one conductivity type. A base region of opposite conductivity type is formed in the collector region of the semiconductor body and has a portion thereof extending to said surface. An emitter region is formed in the base region and has portions thereof extending to said surface. The emitter region is a region of bombardment implanted substitutional ions of an impurity element characteristic of said one conductivity type. An insulating layer overlies the surface and is adherent thereto. The insulating layer has windows which are formed simultaneously therein for exposing said surface in areas overlying said portions of the base and emitter regions extending to said surface. The insulating layer is formed on the surface at least prior to the formation of the emitter region. Contact elements are formed on the layer of the insulating material and make contact through said windows to at least the base and emitter regions.

In the method, a metallic layer is utilized as a mask to prevent damage by ion bombardment of the layer of insulating material underlying the metallic layer and to monitor the ion current.

In general, it is an object of the present invention to provide a bipolar transistor structure which has greatly improved characteristics because of the use of at least one ion-implanted region.

Another object of the invention is to provide a structure and method which is particularly applicable to complementary transistors.

Another object of the invention is to provide a method of the above character in which the NPN transistor of the complementary transistor pair is formed exclusively by diffusion and wherein PNP transistor of the complementary transistors has at least one region formed by ion bombardment.

Another object of the invention is to provide a structure and method which makes it possible to obtain increased yield in circuits per wafer.

Another object of the invention is to provide a structure and method of the above character which makes it possible to obtain improved radiation resistance.

Another object of the invention is to provide a structure and method of the above character in which the openings in the layer of insulating material for at least the collector and emitter are formed simultaneously after which the layer of insulating material is not removed.

Another object of the invention is to provide a structure and method of the above character which makes it possible to provide ion implanted regions that are defined by junctions having outer margins which extend outwardly and upwardly through the surface and below the layer of insulating material.

Another object of the invention is to provide a structure and method of the above character in which the metal layer is set back with respect to the layer of insulating material to provide a rounding effect for the junction.

Another object of the invention is to provide a structure and method of the above character in which all the windows which are required for fabrication of the device can be formed in the layer of insulating material at one time.

Another object of the invention is to provide a structure and method of the above character which can be utilized for discrete devices or integrated circuits.

Another object of the invention is to provide the structure and method of the above character which can be utilized with dielectric isolation.

Additional objects and features of the invention will appear from the following description in which the preferred embodiments are set forth in conjunction with the accompanying drawings.

DESCRIPTION OF THE PREFERRED EMBODIMENTS

Figures 1, 2, 3, 4, 5, 6, 7, 8:
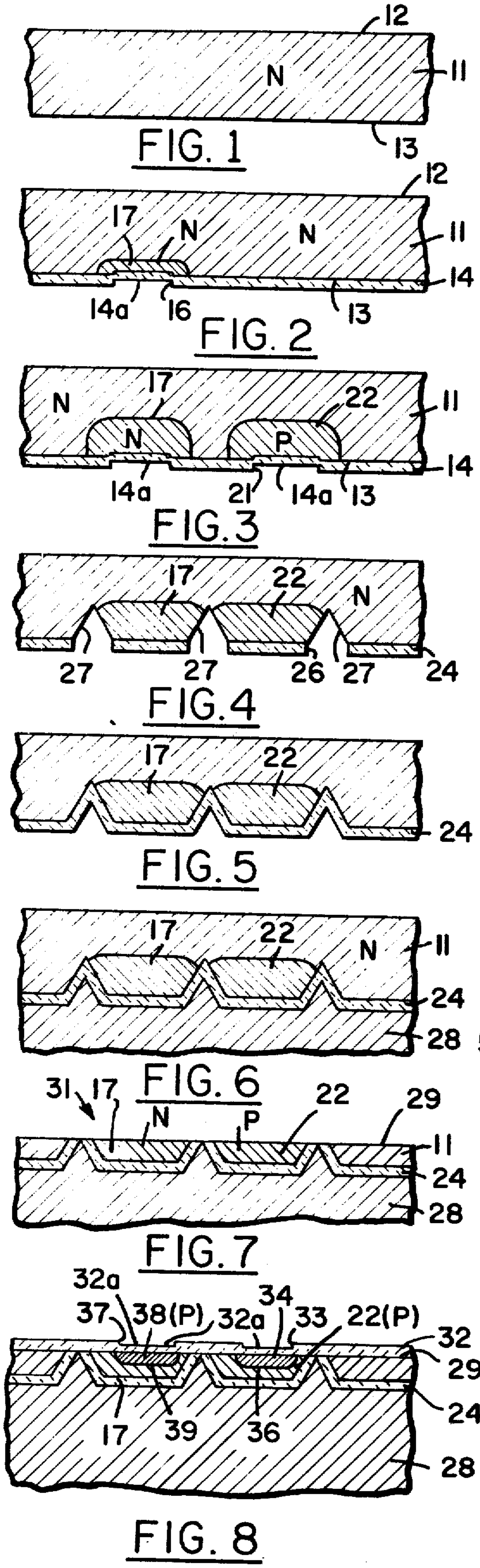
FIGS. 1 through 12 are partial cross-sectional views illustrating the steps for fabricating a bipolar transistor structure of the complementary type incorporating the present invention.

In FIGS. 1 to 12 there are shown cross-sectional views of a semiconductor structure and the steps for fabricating a complementary bipolar integrated circuit using an ion implanted emitter. As shown in FIG. 1, a semiconductor body wafer 11 is taken which is formed of a suitable material such as single crystal silicon. The semiconductor body wafer 11 can be doped with an impurity or be undoped. If it is undoped, it is necessary to diffuse an impurity of a first conductivity type into at least a portion of the body. Preferably, it is desirable to obtain a body wafer 11 having an impurity of the first conductivity type diffused therein. Thus, as shown in FIG. 1, the body 11 can have an N type impurity therein.

The body wafer 11 is lapped and polished to provide two planar parallel surfaces 12 and 13. A layer 14 of insulating material, as for example silicon dioxide is formed on at least the surface 13 by placing the semiconductor body 11 in an oxidizing atmosphere.

Windows or openings 16 are then formed in the layer 14 at locations where it is desired to place NPN devices. The windows 16 are formed by conventional photolithographic and etching techniques to expose the surface 13. Thereafter, the desired N+ type impurity such as antimony, arsenic or phosphorus is deposited through the windows 16 in a thermal diffusion step to a very slight depth to form an N+ region 17 as shown in FIG. 2. During the time this diffusion step is being carried out, a thin silicon dioxide layer 14*a* grows in the windows 16 to cover the surface 13.

Additional windows 21 are formed in the silicon dioxide layer 14 overlying the surface 13 in locations in which it is desired to form PNP type devices. The windows 21 are also formed in a conventional manner. A P type impurity such as boron is then diffused through the windows 21 to form a P type region 22 which is defined by a dish-shaped PN junction which extends to the surface 13. The regions 17 and 22 are then driven down to the desired depth by subjecting the semiconductor body 11 to the appropriate temperature such as 1295°C for an appropriate period of time. The depth to which the diffused regions 17 and 22 are driven is dependent upon the function which the devices are to perform in the circuit. For certain applications collector regions ranging in depth from 16 to 20 microns are adequate. For high voltage application it is desired to utilize deeper collector regions, as for example 60 microns and for high-speed devices, collector regions having a depth of 5 microns would be advisable. Thus, it can be seen, that the regions 17 and 22 can have depths ranging from 3 microns to 70 microns. By way of example, it has been found that the regions 17 and 22 can be driven to depths of approximately 60 microns within approximately 60 hours at a temperature of 1295°C. Although this diffusion operation is relatively slow, it is quite simple and is completed before other work is done on the semiconductor body wafer. The long exposure of the semiconductor body 11 to a high temperature does not affect the other properties of the semiconductor body.

It is important that in carrying out diffusion step as set forth in FIG. 3 that the desired concentration of impurities be present in each of the regions 17 and 22. It should be readily appreciated by anyone skilled in the art, that the regions 17 and 22 can be tailored to fit the needs of the circuit. For example, if one type of impurity diffuses more rapidly than the other, it is possible to first diffuse the slower diffusing impurity and to drive it sufficiently far so that when the other impurity is diffused into the semiconductor body both impurities can be driven to the desired depths in the body simultaneously and with the desired concentration in the diffused regions.

After the diffusion step as shown in FIG. 3 has been completed, the silicon dioxide layer 14 can be stripped and a new silicon oxide layer 24 grown on the surface 13. Windows or openings 26 are then formed in the silicon dioxide layer 24 which surrounds or encompass the regions 17 and 22. After the windows 26 have been formed, a suitable etch such as an anisotropic etch is utilized for forming V-shaped moats 27. The openings 26 are of a width so that the V-shaped moats will extend to a depth which is generally as great as the depth of the regions 17 and 22 in the semiconductor body 11. As it is well known to those skilled in the art, the depth of which the V-shaped moats will be formed in the semiconductor body 11 is determined by the width of the openings 26 through which the anisotropic etch can attack the silicon in the semiconductor body (see FIG. 4).

After the moats 27 have been formed in the semiconductor body, the surfaces of the semiconductor body exposed in the moats 27 are covered with a silicon dioxide insulating layer 24 by placing the semiconductor body in a heated oxidizing atmosphere.

After the moats 27 have been oxidized as shown in FIG. 5, a support body or structure 28 provided on the silicon dioxide layer 24 and is strongly adherent thereto. This can be accomplished by growing polycrystalline silicon on the silicon dioxide layer 24 to the desired depth in a manner well-known to those skilled in the art.

Thereafter, a substantial portion of the semiconductor body or wafer 11 is removed in a suitable manner such as lapping and polishing until a planar surface 29 is formed through which the insulating layer 24 in the moats 27 extends through the surface and provides a plurality of islands 31 which are dielectrically isolated from each other and from the support body by the insulating layer 24. The depth of the regions 17 and 22 can be of any desired depth, as for example ranging from 3 microns to 70 microns. The depth of the regions 17 and 22 is determined by the length of time the long diffusion is carried out.

After isolated islands 31 have been shown in FIG. 7, a layer of insulating material 32 formed of a suitable material such as silicon dioxide is either thermally grown or deposited on the surface 29 to cover the surface 29. Thereafter, windows or openings 33 are formed in the layer 32 to expose the surface 29 in regions overlying the P type regions 22. An N type impurity is then diffused through the openings 33 to provide an N type base region 34 within the P type regions 22 and which is defined by a PN junction 36 which is dish-shaped and which extends to the surface 29 along a long underlying the layer 32. During the diffusion step, a thin oxide layer 32*a* grows in the openings 33.

Additional windows 37 are then formed in the oxide layer 32 in a conventional manner to expose the surface 29 in areas overlying the N type regions 17. A P type impurity is diffused through the openings 37 to form P type regions 38 within the region 17 which are defined by dish-shaped PN junctions within the region 17 which are defined by dish-shaped PN junctions 39 which extend to the surface 29 and form a line underlying the layer 32. A thin oxide layer 32*a* also grows in the windows 37 during the diffusion of the P type impurity.

Windows 41 and 42 are then formed in the layer 32 to expose the surface 29 in such a manner that the windows 41 overlie the base regions 38 and the windows 42 overlie the collector regions 17. N type impurities are then diffused through openings 41 and 42 so that there is formed within the base region 38, an emitter region 43 that is defined by a dish-shaped PN junction 44 which extends to the surface 29 and defines a line under the layer 32. An N+ collector contact region 47 is formed under each of the windows 42. At this stage, the structure shown in FIG. 9 is ready for the formation of the emitter of the PNP device.

Thereafter, the silicon dioxide layer 32 can be stripped in a conventional manner such as by the use of a suitable etch and a new layer 51 formed of a suitable insulating material such as silicon dioxide can be either thermally grown or deposited on the surface 29. The oxide layer 51 is grown to a relatively precise thickness so that it can serve as an appropriate mask for the ion implantation step hereinafter described. In general, it is desirable that the thickness of the oxide which is indicated by the letter *t* (see FIG. 10) be significantly less than the depth of the emitter which is to be formed in the PNP type device. By way of example, with a base in a PNP device having a depth of 0.75 microns and an emitter having a depth of 0.5 microns the silicon dioxide layer could have a thickness of approximately 0.25 microns or possibly a thickness ranging from 0.2 to 0.4 microns.

A plurality of windows or openings 52, 53, 54, 56, 57 and 58 are then formed in the oxide layer 51 in a conventional manner in a position so that each opening 52 is for making contact to the collector contact region 47, each opening 53 for the base region 38 and each opening 54 for the emitter region 43 of the NPN device. The opening 56 is provided for making contact to the collector region 22, opening 57 for making contact to the base region 34 and opening 58 for making contact to the emitter region of the PNP device. Thus, it can be seen that all of the windows required for making contact to the NPN and PNP devices are formed at the same time.

Figures 9, 10, 11:
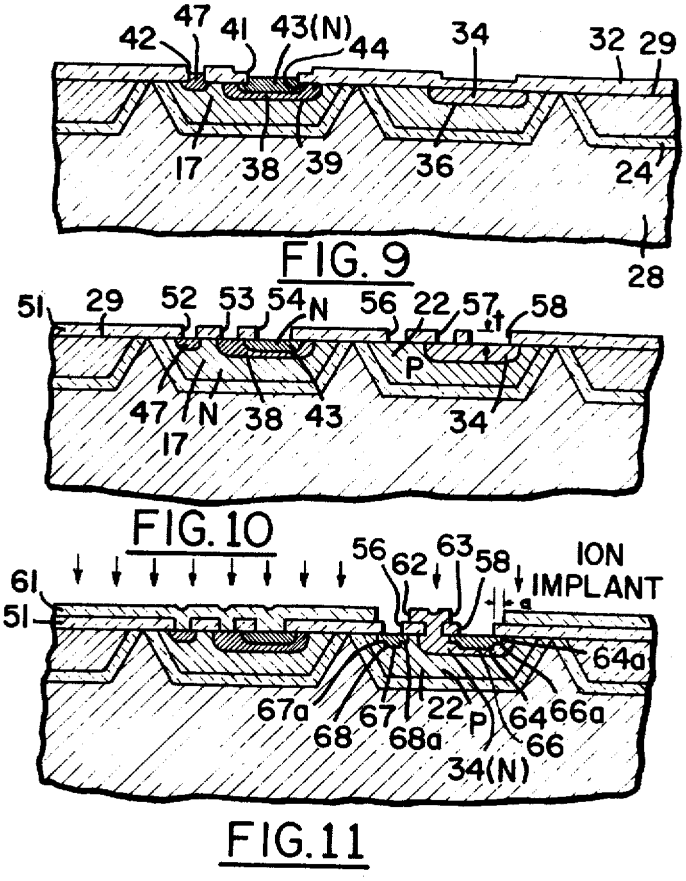

After the openings or windows have been cut as shown in FIG. 10, a metallic layer 61 formed of a suitable material such as aluminum is evaporated or deposited on the surface of the silicon dioxide layer 51 and into all of the openings which have been formed so that they are covered. The layer 61 is formed of a material having a thickness which is sufficiently great so that substantially none of the ions utilized in the subsequent ion implantation step will pass completely through the layer 61 and the layer 51 to implant impurities into the isolated islands 31.

Openings or windows 62 and 63 are formed in the aluminum layer 61 by the use of a suitable etch to expose the surface 29 overlying the collector contact region to be formed in the region 22 and the emitter region to be formed in the base region 34. It will be noted that the openings 63 and 62 are slightly larger than the openings 56 and 58 formed in the silicon dioxide layer 51. This difference in dimensions is indicated by the letter *a* in FIG. 11 and by way of example can be in the order of 1 to 2 microns. However, this dimension is not critical. It is primarily dependent upon how far it is desired to bring the emitter under the surface of the oxide layer 51.

As soon as the openings 62 and 63 have been formed in the metal layer 61, the wafer or semiconductor body is ready for deposition of a P type impurity such as boron by means of ion implantation.

The boron depostion is carried out by introducing a suitable gas such as boron trifluoride to a conventional linear accelerator which causes boron ions to be formed and rapidly accelerated in the form of a beam which is directed to impinge upon the semiconductor structure shown in FIG. 11 in the direction indicated by the arrows.

As is well known to those skilled in the art, the penetration of the ion beam is dependent on the atomic weight of the substrate atoms, the atomic weight and thickness of the substrate mask, the orientation of the substrate to the beam, the atomic weight of the ions in the ion beam and the energy of the ions beam. By way of example, the semiconductor structure as shown in FIG. 10 can be implanted with $10^{20}$ boron ions per cubic centimeter at 100 keV.

As shown in FIG. 11, the boron implantation causes the formation of a P type region 64 within the region 34 which is defined by a PN junction 66 which extends to the surface 29 beneath the silicon dioxide layer 51. Similarly there is provided a P+ region 67 which is defined by a junction 68 that also extends to the surface 29 beneath the silicon dioxide layer 51. As can be seen from FIG. 11, the region 64 is provided with a portion 64*a* and the region 67 is provided with a similar portion 67*a* which has a depth which is significantly less than the depth of the remaining portions of the regions. This is caused by the fact that the ion implantation for these portions of these regions must be carried out through the silicon dioxide layer 51. The aluminum layer 61 serves as the main mask for the ion beam and serves to prevent the boron ions from being implanted in the portions of the isolated island immediately underlying the metal layer 61 and not exposed by the openings 62 and 63 in the metal layer 61. In other words, the layer 61 is of sufficient thickness so that during the formation of the regions 64 and 67, ions will not penetrate the layers 61 and 51. Thus, the portions of the region 64 and 67 exposed both through the openings 56 and 62, and 58 and 63 are of the greatest depth whereas the portions 64a and 67a exposed only through the openings 62 and 63 are driven to a lesser depth because the ions must travel through the silicon dioxide layer 51. This causes formation of the step 66a in junction 66 and the step 68a in the junction 68. It should be appreciated that with the foregoing step that the important consideration is that the emitter region has a stepped construction for reasons hereinafter pointed out. The stepped construction for the collector contact region 67 is unimportant but is used to avoid additional processing steps.

The lateral dimensions and the depth of the regions 64 and 67 can be precisely controlled by ion implantation. As shown the profiles of the regions 64 and 67 at the surface 29 correspond exactly to the geometry of the holes 56 and 58 formed in the oxide layer 51 and the windows or holes 62 and 63 formed in the metal layer 61. It can be seen by controlling the thickness of the oxide layer 51, the depth of the portions 64*a* and 67*a* with respect to the remaining portions of the regions 64 and 67 can be readily controlled.

The use of the conducting metal in the form of aluminum for a mask rather than a thicker silicon dioxide layer is advantageous for several reasons. It has been found in the past that the ion beam used for the ion implantation impairs the silicon dioxide substantially so that its etching characteristics are effected to make subsequent etching difficult. In addition, the metal layer can be utilized as a ground plane for metering the Ion beam current to which the substrate is exposed. This is particularly advantageous where the devices are dielectrically isolated as in the embodiment hereinbefore described.

From the foregoing it can be seen that ion implantation gives an additional degree of freedom in the manufacture of semiconductor devices. For example, as shown it makes it possible to deposit an emitter in a PNP type device without bringing the substrate up to a high temperature as would be required if the emitter were diffused into the PNP device. Such a diffusion step would affect the characteristics of the NPN device and for that reason it would be necessary to compromise the characteristics of one or both of the devices to obtain optimum results.

After the ion implantation has been carried out as shown in FIG. 11, the metal layer 61 is removed in a suitable manner such as by etching. In view of the fact that all of the windows or openings have been previously formed as shown in FIG. 10, the devices can be tested because all the devices are accessible through the silicon dioxide layer 51. In other words, contact can be made to all of the various regions forming the devices.

Figure 12:
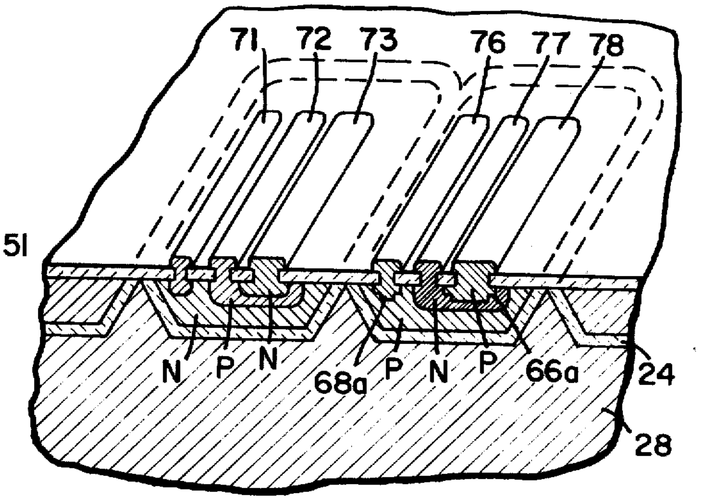

Before testing is accomplished it may be desirable to anneal any radiation damage which may have occurred in fabrication of the devices by the ion implantation and to make the implanted ions electrically active. This is accomplished in a manner well known to those skilled in the art by elevating the wafer or semiconductor body to a suitable temperature for a predetermined period of time. By way of example, the semiconductor body can be brought up to a temperature of 645°C for a period of 20 minutes in a nitrogen atmosphere. It is desirable that the temperature utilized for annealing be sufficiently low so that the junctions forming the active devices are not shifted significantly during the annealing operation. During the annealing operation, the sharp edges formed by the steps 66*a* and 68*a* will be rounded out as shown in FIG. 12. Also during the annealing operation, it is desirable that substantially all, as for example as many as 98%, of the implanted ions be made electrically active in which the ions are transferred from interstitially deposited ions into substitutionally positioned ions. In other words, annealing causes the initially implanted ions which are interstitial in the lattice structure to be given sufficient energy so as to permit them to move into vacancies existing in the lattice structures and thereby becoming substitutional ions. The annealing also removes radiation damage.

After the annealing operation and after testing of the devices, suitable contacts can be formed on the semiconductor structure. This can be accomplished by depositing a metal layer such as a metal layer of aluminum on the surface of the silicon dioxide layer 51 and into the openings or windows in the silicon dioxide layer. Thereafter, the undesired portions of the metal layer can be removed by suitable means such as an etch so that there remain contact stripes 71, 72 and 73 for the NPN device and contact stripes 76, 77 and 78 for the PNP device. There also will remain additional metallization for interconnecting the two complementary devices in the integrated circuit of which the semiconductor structure shown in FIG. 12 forms a part thereof. The stripe 71 forms a contact to the collector region, stripe 72 to the base region and stripe 73 to the emitter region of the NPN device whereas stripe 76 forms a contact to the collector region, stripe 77 to the base region and stripe 78 to the emitter region of the PNP device.

Alternatively, if desired, if thicker insulation is required for high voltage device than that which is provided for by the insulating layer 51, a low temperature glass can be deposited on the silicon dioxide layer 51 at a suitable temperature, as for example, 300°C. The glass can be deposited to a suitable thickness, as for example, 5000 Angstroms or one-half of a micron. The glass can be stabilized during the annealing operation which could be carried out at a temperature of 1050°C for a period of 10 minutes.

If low temperature glass is utilized as hereinbefore described, it is necessary to form new openings through the glass and through the silicon dioxide layer 51 to make contact with the various regions of the NPN and PNP devices and to thereafter deposit a metal layer and etch away the undesired portions to provide contact elements or stripes in the manner hereinbefore described.

From the foregoing it can be seen that the present invention makes possible the fabrication of complementary NPN and PNP devices by combining existing diffusion technology with low temperature ion beam implantation in such a manner that critical high temperature processing is minimized and/or limited to steps which are relatively insensitive to holding critical dimensional tolerances in the devices.

Use of a single ion implanted boron layer for the emitter of the PNP transistors in the fabrication sequence of the complementary bipolar devices provides substantial improvement in frequency performance of the PNP devices. In addition, the ability to fabricate the emitter of the PNP device at low temperature gives additional advantages. It increases the yield in circuits per wafer due to the precise and independent control. It improves the radiation resistance of the semiconductor structure due to the shallow junction of the PNP transistor. It makes possible performance for complementary structures which cannot be duplicated by existing diffusion techniques.

With the present method, state of the art technology can be utilized for fabricating the best possible NPN transistor in the complementary structure. The PNP devices in the complementary structure can then be fabricated utilizing the ion implanted emitter to optimize the PNP structure while at the same time not appreciably affecting the characteristics of the NPN device in the complementary structure.

It should be appreciated that, if desired, ion implantation can be utilized for forming other regions of the devices of the complementary structure if its is desirable to do so. Generally, with the present state of the art, it is more practical to diffuse as many of the regions as possible because the cost of ion implantation is usually greater. For reasons pointed out above, the ion implantation of the emitter in the PNP device of the complementary structure is particularly advantageous because it eliminates the thermodynamic restriction heretofore placed on the fabrication of such structures.

Figure 13:
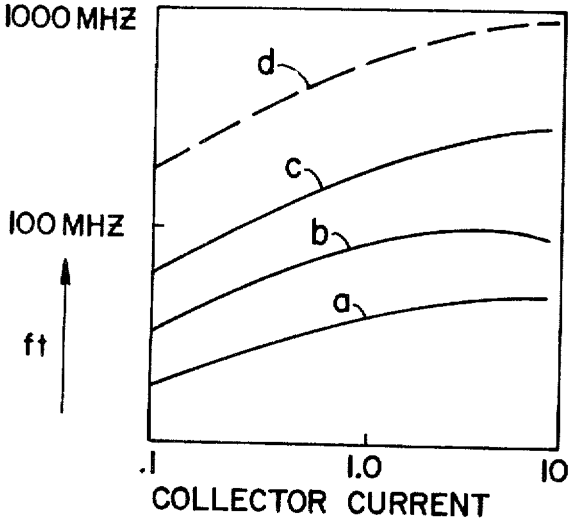
FIG. 13 is a graph showing performance characteristics of certain types of transistor structures.

In FIG. 13 there is shown a graph in which the figure of merit ($f_t$) is plotted as a function of collector current for various types of devices at $V_{CE}$=5 volts. The curves are the $f_t$ for the PNP device in a complementary structure fabricated at the same time with an NPN device. Curve *a* gives the results for the PNP device in a [100] crystal orientation whereas curve b gives the results for a [111] crystal orientation using diffusion techniques. Curve *c* gives the results for PNP devices in a complementary structure utilizing the same physical layout and the same masks as for curves *a* and *b* but utilizing an ion implanted emitter as taught in the present invention. The frequency performance was 300 MHz compared to 40 MHz and 100 MHz for the structure shown in Curves *a* and *b*. Curve *d* is an extrapolated curve which projects the possible improvements which can be obtained utilizing a PNP device with an ion implanted emitter and optimizing all the parameters. Thus it can be seen that very high frequency operation should be obtainable with complementary structures incorporating the present invention.

Figure 14:
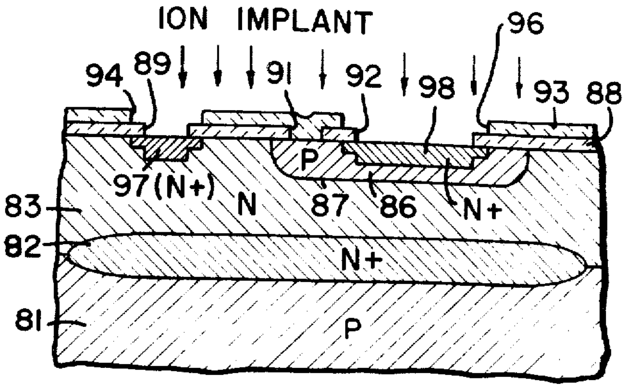
FIGS. 14 and 15 are cross-sectional views showing the steps for fabricating another embodiment of the bipolar transistor structure incorporating the present invention particularly adapted for discrete devices.
Figures 15, 16, 17, 18:
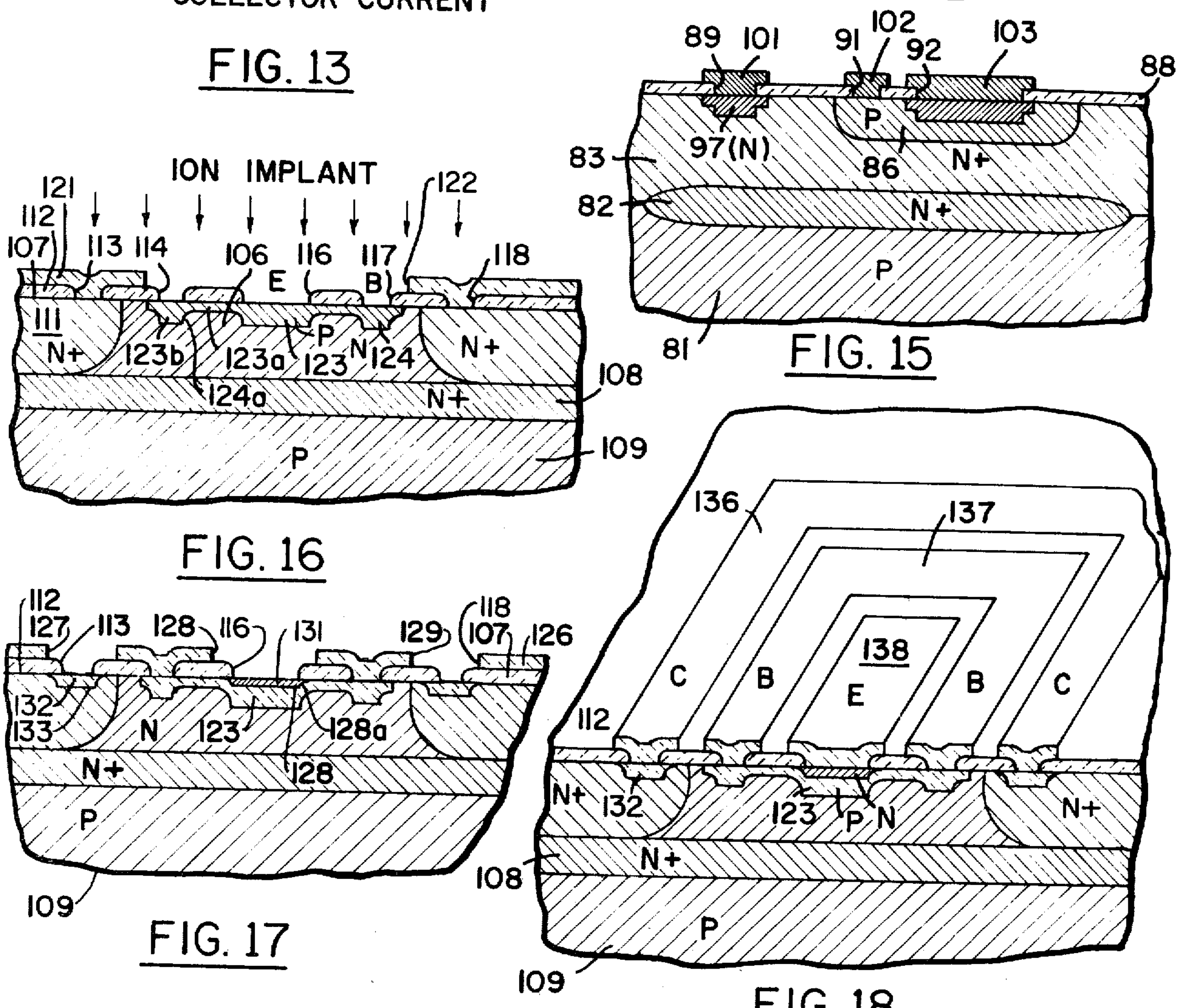
FIGS. 16, 17 and 18 are partial cross-sectional views showing the steps for fabricating still another embodiment of the bipolar transistor structure incorporat ng the present invention showing the use of ion implanted base and emitter regions.

Another embodiment of the invention shown in FIGS. 14 and 15 shows the application of the present invention to ion implanted emitter for either NPN or PNP transistors without such transistors being a part of a complementary structure. In providing such a device, a semiconductor body 81 is utilized which is provided with a P type impurity. A buried layer 82 is formed in the semiconductor body 81 and thereafter, an epitaxial layer 83 containing an N type impurity is formed on the semiconductor body 81. A silicon dioxide layer (not shown) is formed on the surface of the epitaxial layer 83 and an opening (not shown) is formed in the silicon dioxide layer. Thereafter, a P type impurity is diffused through the opening to form the P type region 86 which is defined by a dish-shaped PN junction 87 which extends to the surface of the epitaxial layer. The silicon dioxide layer on the surface of the epitaxial layer 83 is stripped and thereafter a passivating layer 88 is formed on the surface of the epitaxial layer 83. The passivating layer 88 is formed of a suitable material such as silicon dioxide which can be either deposited or thermally grown. It is desirable that the layer have a relatively precise thickness to aid in the formation of the emitter as herebefore described in connection with the previous embodiment.

All of the openings required for making contact to the device are formed in the silicon dioxide layer 88 by conventional techniques and are positioned in such a manner that the opening 89 is provided for making contact to the collector region, opening 91 is provided for making contact to the base region and opening 92 is provided for making contact to the emitter region. A metal mask is formed on the silicon dioxide layer 88 by evaporating a suitable metal such as aluminum over the surface of the silicon dioxide layer to cover the silicon dioxide layer and to fill the openings 89, 91 and 92. Thereafter, windows or openings 94 and 96 are formed in the metal layer 93. As in the previous embodiment the openings 94 and 96 are slightly larger than the openings 89 and 92. The advantage of being able to make the collector, base and emitter openings all at the same time is significant because this makes it possible to eliminate the misalignment which might occur from using additional masks. Thus, at least one or two misalignment tolerances are eliminated by forming all three openings at the same time.

In a typical high frequency device, the base would have a depth of 0.75 microns and the emitter a depth of 0.5 microns. With such an emitter, the aluminum layer 93 would have a thickness between 4000 and 5000 Angstroms or between 0.4 and 0.5 microns. The openings 94 and 96 in the aluminum expose surface of the layer 88 over the collector region and the emitter region to be formed. An N type impurity such as phosphorus ions is implanted through the openings 89 and 94 and the openings 92 and 96 to provide regions 97 and 98. The regions 97 and 98 are provided with steps for the same reason that steps were formed in the previous embodiment. The ion implantation is carried out in a conventional manner to provide a region 98 that has sufficient depth or thickness.

After the ion implantation has been completed, the aluminum layer 93 is stripped so that all the openings 89, 91 and 92 are exposed. The semiconductor body is then annealed to remove the radiation damage and to convert the interstitial ions into substitutional ions in the manner hereinbefore described. During this annealing step, the stepped portions of the regions 97 and 98 become slightly rounded as shown in FIG. 15.

After the annealing step has been completed, a layer of suitable metal such as aluminum is deposited on the surfaces of the silicon dioxide layer 88 into the holes or windows 89, 91 and 92. The undesired metal is removed so that there remain contact stripes 101, 102 and 103, which contact stripe 101 making contact with the collector region, contact stripe 102 making contact with the base region and contact stripe 103 making contact with the emitter region to thereby complete the device.

In the annealing operation, it may be desirable to increase the temperature to permit the heavily implanted emitter to diffuse more rapidly than the base to cause pinching of the base width to a minimum thickness. By using ion implantation for the emitter and making use of the fact that the small thickness of oxide will only partially stop implantation, it is possible to obtain geometries that are as small as those obtained only with the prior art washed-out emitter process, but without the E–B short problem which results from alloying of aluminum into the Si—$SiO_2$ interface with the washed-out emitter processes. By providing a controlled thickness of oxide which will only stop the ion beam partially around the periphery of the emitter while the remainder of the emitter is deposited to its full thickness, there is provided an overlap which will prevent the alloying of aluminum and prevent the emitter base shorts that are common in the washed-out emitter construction. The overlap caused by the extension of the emitter region by having ion implantation pass through the silicon dioxide layer provides a safety margin which prevents the preferential alloying of the aluminum contact to the interface of the silicon and silicon dioxide.

From the foregoing it can be seen that the construction shown in FIGS. 14 and 15 has the same advantages as in the previous embodiments in that it makes possible the cutting of the contact holes all at the same time which will eliminate misalignment tolerances and thereby makes possible closer spacing between contact windows within base and emitter.

Another embodiment of the invention is shown in FIGS. 16 through 18 in which ion implantation techniques are utilized to deposit controlled amount of impurities to form the base and emitter of a bipolar transistor structure which can be utilized in conjunction with either discrete devices or integrated circuits.

In fabricating such a structure, a semiconductor support body 109 having the desired impurity, as for example a P type impurity throughout is used as a support structure. An N+ semiconductor layer 108 is formed on the support body 109 in a conventional manner such as by epitaxial growth. A semiconductor body 106 carrying N type impurities of a lesser concentration than the layer 108 is also formed in a conventional manner such as by epitaxial growth. The body 106 has an upper planar surface 107.

A mask (not shown) of a suitable material is provided on the surface 107 and openings are formed therein and N type impurities diffused therethrough to provide the regions 111 which extend downwardly from the surface and make contact with the N+ layer 108. The N+ regions are provided for making contact to the collector region of the devices hereinafter formed through the top side of the semiconductor body.

If desired, the silicon dioxide layer used as a mask for forming the regions 111 can be stripped and a new layer 112 formed of a suitable material such as silicon dioxide which is either thermally grown or deposited on the surface 107 to a relatively precise thickness for reasons set forth in connection with the preceding embodiments.

By way of example, the silicon dioxide layer 112 can have a thickness of 3000 Angstroms. A plurality of windows or openings 113, 114, 116, 117 and 118 are formed in the silicon dioxide layer 112 by a suitable etch. As is well known to those skilled in the art, a photoresist is deposited on the surface of the silicon dioxide layer 112 and exposed and then developed to remove the photoresist from the undesired areas. The exposed areas of the silicon dioxide layer 112 are then etched to form the openings which extend to expose the surface 107 of the body 106. Thereafter, the photoresist is removed and then the etching operation is continued. It has been found as shown on the drawings, that the etch will attack the sharp corners of the silicon dioxide layer adjacent to the openings so as to round the sharp corners or edges adjacent to the openings as shown in FIG. 16. It is believed that this more rapid etching occurs because the etchant is replenished more rapidly at the corner than at any other exposed surfaces of the silicon dioxide layer 112. The openings 113 and 118 will serve for making contact to the collector regions, the openings 114 and 117 for making contact to the base regions and the openings 116 for making contact to the emitter region.

After the openings heretofore described have been formed, a layer 121 formed of a suitable metal such as aluminum is deposited over the surface of the silicon dioxide layer 112 and into the openings 113, 114, 116, 117, and 118 to a thickness of approximately 6000 Angstroms. By conventional photolithographic and etching techniques, or a large opening 122 is etched into the aluminum layer 121 to expose the surface 107 in the openings 114, 116 and 117 and the portions of the silicon dioxide layer 112 therebetween.

Ion implantation of the character hereinbefore described is utilized for implanting a P type impurity such as boron into the semiconductor structure to form a base region 123 that is defined by a PN junction 124 which is irregularly shaped as shown in FIG. 16 and which extends to the surface 107. The boron implantation was carried out to a depth of approximately 4000 A to achieve a concentration of approximately $8\times10^{18}$ atoms per cubic cm. It will be noted from FIG. 16 that the base region does not have the same depth throughout but has portions **123*a* which are much shallower than portions 123*b*. This difference in the depth of the base region 123 occurs because the portions of the silicon dioxide layer 112 overlying these regions arrests travel of some of the ions which are implanted whereas the ions passing through the openings 114, 116 and 117 are free to pass immediately into the semi-conductor body 106 and are thus able to penetrate into a greater depth. It will be noted that the transition from the deeper portions 123*b* to the shallower portions 123*a* is graduated or curved rather than being step-like as indicated by the curved portion 124*a* of the junction 124. This curved effect is obtained because of the curved or rounded corners formed on the silicon dioxide layer forming the openings 114, 116 and 117.**

After the boron implantation has been carried out as shown in FIG. 16, the aluminum layer 121 is stripped and thereafter a new aluminum layer 126 is deposited on the silicon dioxide layer 112 and into all of the openings formed in the silicon dioxide layer to a suitable depth, as for example 3000 Angstroms. Openings or windows 127, 128 and 129 are then formed in the aluminum layer 126 by conventional etching techniques to expose the surface 107 through the openings 113, 116 and 118. Again it will be noted that the openings 127, 128 and 129 are slightly larger than the corresponding openings 113, 116 and 118 for reasons hereinbefore described in conjunction with the previous embodiments. Any slight misalignment of the aluminum mask is relatively unimportant because the outline for the emitter and the collector contact regions is defined by the openings 113, 116 and 118 which were all made at the same time with the other openings which were cut into the silicon layer 112.

The emitter is now deposited by ion implantation of an N type impurity such as phosphorous to a suitable depth such as 2000 Angstroms and obtaining a concentration of $1\times10^{20}$ atoms per cubic cm.

The implant of the phosphorous ions provides an emitter region 131 within the base region 123 and which is defined by a PN junction 128 which is generally dish-shaped and extends to the surface 107. The PN junction has an outer curved margin which is obtained because of the curved corners or edges provided on the portions of the insulating layer 112 forming the opening 116. Similarly there are formed N+ collector contact regions 132 defined by a junction 133 which is also dish-shaped and has a curved outer margins which extend to the surface 107. The aluminum layer 126 is of such a thickness that the phosphorous ions do not penetrate into the portions of the silicon dioxide layer 112 which are covered by the aluminum layer.

After the phosphorous implantation has taken place, the aluminum layer 126 is stripped and the structure is annealed in the manner hereinbefore described. In many applications, it is desirable that there be a very narrow distance between the emitter and the collector, to provide a very narrow base width. Considering the fact that the base concentration is considerably lower than the emitter concentration and the diffusion coefficients are approximately equal because of the high concentration of the impurities in the emitter, the emitter will diffuse downwardly faster when it is elevated to a predetermined temperature. Thus, it is possible to obtain a decrease in the base width by temperature treatment of the semiconductor structure shown in FIG. 17. This temperature treatment could be carried out in two steps. A low temperature treatment, as for example, at 600°C could be utilized to eliminate the damage created by ion implantation. Such a temperture would have very little tendency to shift the junctions in the structures. However, if after treatment at low temperature the entire semiconductor structure is raised to a temperature of 900° to 1000°C, diffusion will commence which by virtue of the different concentrations hereinbefore described will pinch or decrease the base width.

After the thermal treatment has been completed, a layer of aluminum is evaporated on the surface of the silicon dioxide layer 112 and then the undesired aluminum is removed by suitable etching techniques so that there remains interconnected collector stripes 136, interconnected base stripes 137 and an emitter stripe 138 as shown in FIG. 18 to show a completed transistor which can form part of an integrated circuit. It will be noted that contact for the collector is being made through the front side.

It should be appreciated that if this construction is utilized in connection with discrete devices contact can be made to the back side of the collector region by removing the P type support structure 109 and securing the bottom side of the N+ layer 108 directly to the header or other package in which the semiconductor structure is mounted to provide good heat sinking for the semiconductor structure. This is particularly important in high power devices where it is desirable to have the collector as thin as possible to provide maximum heat sinking.

It should be appreciated that even although one emitter stripe 138 has been shown in the semiconductor structure, that additional emitter stripes can be added if desired. For example, if two emitter stripes are desired then it would be necessary to provide three base stripes and two collector stripes.

It is apparent from the foregoing embodiments of the present invention that there has been provided a new and novel semiconductor structure and method for fabricating the same which is particularly applicable to bipolar devices. In all of the embodiments, the method herein disclosed makes possible the cutting or the formation of all the windows at one time and at the beginning of the process which are necessary for the formation of a bipolar device. This is important because the same silicon dioxide layer can be left in place thus keeping the surface of the semiconductor body clean. It also makes possible very close tolerances between the openings because it eliminates completely misalignment between successive masking steps. In addition it makes possible much closer tolerances for individual openings because the openings are cut through silicon dioxide layers of the same thickness. Also the present method makes it possible to make adjustments on the oxide layer, as for example, rounding the edges forming the openings. By offsetting the metal mask, it is possible to provide junctions which are curved upwardly and outwardly toward the surface so that the junction overlaps the opening and underlies the oxide layer to prevent alloying of the aluminum contact and thereby preventing emitter base shorts.

It is also apparent from the foregoing that there has been provided a bipolar transistor structure which makes it possible to fabricate such structure to obtain increased yield in circuit per wafer. In complementary structures, improved radiation resistance is obtained because of the shallow emitter junction of the PNP transistor. In addition, in the complementary structure, unique high performance characteristics are obtained which cannot be duplicated by present diffusion techniques.

In summary, utilizing ion implantation as means for introduction of impurities into semiconductors allows formation of devices at low temperatures. This added "degree of freedom" in fabrication permits manufacture of shallow structures and combinations of complex structures not attainable by all-diffusion techniques.

We claim:

1. In a bipolar transistor structure, a semiconductor body having a substantially planar surface, a collector region of one conductivity type formed in the semiconductor body, a base region of opposite conductive type formed in the collector region of the semiconductor body and having a portion thereof extending to said surface, an emitter region formed in the base region and having a portion thereof extending to said surface, said base region having a depth which is substantially less at the edges of the emitter region than at an intermediate portion of the base region, an insulating layer overlying said surface and being adherent thereto, and metallic contact elements formed on said layer of insulating material and extending through said layer of insulating material and making contact with at least said base and emitter regions.

2. A structure as in claim 1 wherein said base region has a deeper portion and shallower portions adjoining the deeper portion and wherein the deeper portion underlies the emitter region.

3. A structure as in claim 2 wherein the transitions between the deeper portion and shallower portions are gradual.

4. A structure as in claim 1 wherein said emitter region is defined by a PN junction which has its outer margin extending upwardly and outwardly to the surface and underlying the insulating layer with the outer margin extending outwardly at least as much as it extends upwardly.

5. A structure as in claim 3 wherein the transitions are in the form of curves.

6. A structure as in claim 2 wherein the lower extremity of the emitter region and the lower extremity of the deeper portion of the base region are substantially planar and parallel.

7. A structure as in claim 1 together with a buried layer underlying the collector region.

8. In a bipolar transistor structure, a semiconductor body having a substantially planar surface, a collector region of one conductivity type formed in the semiconductor body, a base region of opposite conductivity type formed in the collector region of the semiconductor body and having a portion thereof extending to said surface, said base region being defined by a PN junction extending to said surface, an emitter region formed in the base region and having a portion thereof extending to said surface, said emitter region being defined by a PN junction extending to said surface, said emitter region being a region of bombardment implanted substitutional ions of an impurity element characteristic of the first conductivity type, an insulating layer overlying said surface and being adherent thereto, said layer having windows therein exposing said surface in areas overlying said portions of said base and said emitter regions extending to said surface, and metallic contact elements formed on said layer of insulating material and making contact through said windows in said layer of insulating material with at least said base and emitter regions, the outer portion of the PN junction defining the emitter region extending upwardly and outwardly to said surface so that its outermost extremity underlies said insulating layer and is spaced from the window exposing a portion of the emitter region, said outer portion of the PN junction having a conformation such that the outer portion of the emitter region decreases substantially in thickness in a graduated manner in a direction towards the outer extremity of the emitter region with the extension in the sidewise direction being at least as great as in a vertical direction.

9. A structure as in claim 8 wherein said layer of insulating material has a predetermined thickness throughout.

10. A structure as in claim 9 wherein the portions of said layer of insulating material forming said windows are provided with rounded edges.

11. A structure as in claim 10 wherein said graduated manner is in the form of a curve.

12. A structure as in claim 8 wherein said graduated manner is in the form of a step.

13. In a bipolar transistor structure, a semicoductor body having a substantially planar surface, spaced apart N and P-type collector regions formed in the body, each collector region having an impurity profile which increases in concentration in a direction away from said surface, P and N-type base regions formed in the N and P-type collector regions respectively and being defined by generally dish-shaped PN junctions which extend to the surface, N and P-type emitter regions formed within the P and N-type base region respectively and being defined by generally dish-shaped PN junctions which extend to the surface, said PN junction defining the P-type emitter region extending upwardly and outwardly to said surface so that its outermost extremity underlies said insulating layer and is spaced from the window exposing a portion of the surface overlying the emitter region, said outer portions of the PN junction defining said P-type emitter region having a concave-like conformation facing away from the P-type emitter region such that the outer portions of the P-type emitter region decrease substantially in thickness in a graduated manner in directions towards the outer extremities of the emitter region, a layer of insulating material overlying said surface and being adherent thereto, said layer having windows therein exposing portions of said surface, and contact elements carried by said surface and extending through said windows to make contact to said regions.

14. A structure as in claim 13 wherein the graduated manner is in the form of a curve.

15. A structure as in claim 13 wherein the graduated manner is in the form of a step.

16. A structure as in claim 13 wherein the PN junctions defining the base regions extend upwardly and outwardly to said surface so that their outermost extremities underlie said insulating layer and are spaced from the windows exposing portions of the surface overlying the base regions, said outer portions of the PN junctions defining the base regions have a conformation such that the outer portions of the base regions decrease substantially in thickness in a graduated manner in a direction towards the outer extremities of the base regions, with the outer portions extending sidewise at least as far as they extend vertically.

17. A structure as in claim 16 wherein the portions of the layer of insulating material defining said windows are provided with rounded edges.

18. A structure as in claim 17 wherein said graduated manner is in the form of a curve.

19. A transistor structure as in claim 13 wherein said regions form NPN and PNP transistors and wherein said NPN and PNP transistors are dielectrically isolated from each other by a layer of insulating material.

* * * * *